US008273268B2

(12) United States Patent
Huang et al.

(10) Patent No.: US 8,273,268 B2
(45) Date of Patent: Sep. 25, 2012

(54) ELECTRICALLY CONDUCTIVE POLYOLEFIN BLENDS

(75) Inventors: Joseph Huang, Burlington, MA (US); George P. Kipouras, San Ramon, CA (US)

(73) Assignee: PolyOne Corporation, Avon Lake, OH (US)

( * ) Notice: Subject to any disclaimer, the term of this patent is extended or adjusted under 35 U.S.C. 154(b) by 311 days.

(21) Appl. No.: 12/673,055

(22) PCT Filed: Aug. 1, 2008

(86) PCT No.: PCT/US2008/071878
§ 371 (c)(1),
(2), (4) Date: Feb. 11, 2010

(87) PCT Pub. No.: WO2009/023448
PCT Pub. Date: Feb. 19, 2009

(65) Prior Publication Data
US 2011/0297890 A1    Dec. 8, 2011

Related U.S. Application Data

(60) Provisional application No. 60/955,435, filed on Aug. 13, 2007.

(51) Int. Cl.
*H01B 1/24* (2006.01)
*H01B 1/02* (2006.01)
*C09B 67/00* (2006.01)

(52) U.S. Cl. .................. 252/511; 252/512; 524/502
(58) Field of Classification Search .................. 252/511, 252/512; 524/502; 525/240
See application file for complete search history.

(56) References Cited

U.S. PATENT DOCUMENTS

| | | | |
|---|---|---|---|
| 4,002,595 A | 1/1977 | Adelman | |
| 4,097,656 A | 6/1978 | Dany et al. | |
| 4,124,747 A * | 11/1978 | Murer et al. ................. | 429/210 |
| 4,169,816 A | 10/1979 | Tsien | |
| 4,265,789 A | 5/1981 | Christopherson et al. | |
| 4,481,131 A * | 11/1984 | Kawai et al. ................. | 252/511 |
| 4,588,855 A * | 5/1986 | Kutsuwa et al. ........ | 174/120 SC |
| 4,731,311 A | 3/1988 | Suzuki et al. | |
| 4,830,832 A | 5/1989 | Arpagaus et al. | |
| 4,967,604 A | 11/1990 | Arpagaus et al. | |
| 4,988,481 A | 1/1991 | Jarvimaki et al. | |
| 5,002,992 A | 3/1991 | Hamanaka et al. | |
| 5,049,850 A | 9/1991 | Evans | |
| 5,083,470 A | 1/1992 | Davis et al. | |
| 5,190,727 A | 3/1993 | Hirsch | |
| 5,214,091 A | 5/1993 | Tanaka et al. | |
| 5,314,825 A | 5/1994 | Weyrauch et al. | |
| 5,460,768 A | 10/1995 | Akao et al. | |
| 5,468,453 A | 11/1995 | Holt et al. | |
| 5,484,838 A | 1/1996 | Helms et al. | |
| 5,498,372 A | 3/1996 | Hedges | |
| 5,550,059 A | 8/1996 | Boger et al. | |
| 5,620,661 A | 4/1997 | Schurbrock | |
| 5,648,727 A | 7/1997 | Tyberg et al. | |
| 5,665,212 A | 9/1997 | Zhong et al. | |
| 5,685,632 A | 11/1997 | Schaller et al. | |
| 5,844,037 A | 12/1998 | Lundgard et al. | |
| 5,855,851 A | 1/1999 | Matsubara et al. | |
| 5,872,177 A | 2/1999 | Whitehouse | |
| 5,883,178 A | 3/1999 | Ohmoto et al. | |
| 5,958,303 A | 9/1999 | Narkis et al. | |
| 6,162,871 A | 12/2000 | Watanabe et al. | |
| 6,210,607 B1 | 4/2001 | Blake et al. | |
| 6,409,942 B1 | 6/2002 | Narkis et al. | |
| 6,448,499 B1 | 9/2002 | O'Brien | |
| 6,479,575 B1 * | 11/2002 | Chu et al. ........................ | 524/495 |
| 6,528,572 B1 | 3/2003 | Patel et al. | |
| 6,689,835 B2 | 2/2004 | Amarasekera et al. | |
| 6,710,129 B2 | 3/2004 | Matayoshi et al. | |
| 6,875,812 B1 | 4/2005 | Akiyama et al. | |
| 7,033,543 B1 | 4/2006 | Panzer et al. | |
| 7,052,771 B2 | 5/2006 | Nieminen | |
| 7,119,139 B2 | 10/2006 | Demain | |
| 7,196,267 B2 | 3/2007 | Sekiguchi et al. | |
| 7,220,590 B2 | 5/2007 | Moritz et al. | |
| 2001/0027269 A1 | 10/2001 | Tanaka et al. | |
| 2002/0055187 A1 | 5/2002 | Treptow | |
| 2003/0152494 A1 | 8/2003 | Moritz et al. | |
| 2004/0016912 A1 | 1/2004 | Bandyopadhyay et al. | |
| 2004/0076550 A1 | 4/2004 | Ruedisser et al. | |
| 2004/0156754 A1 | 8/2004 | Fritz et al. | |
| 2005/0079104 A1 | 4/2005 | Polwart et al. | |
| 2005/0148724 A1 * | 7/2005 | Tanaglia ........................ | 524/495 |
| 2006/0100368 A1 | 5/2006 | Park | |
| 2006/0115971 A1 | 6/2006 | Bau et al. | |
| 2006/0124906 A1 | 6/2006 | Bradley et al. | |
| 2006/0153736 A1 | 7/2006 | Kalra et al. | |
| 2006/0233669 A1 | 10/2006 | Panzer et al. | |
| 2008/0161474 A1 * | 7/2008 | Shimouse et al. ............. | 524/449 |
| 2010/0273918 A1 * | 10/2010 | Rigosi ............................ | 524/68 |

FOREIGN PATENT DOCUMENTS

JP    H08-165388    *  6/1996

OTHER PUBLICATIONS

Basell Service Company, "Pro-fax EP390S" (2003). Sunoco Chemicals, "Sunoco PP TI-5600-M" (2005).
Cabot Corporation, "Vulcan XC72R" (2002).
PAJ, Abstract of JP2000-159951 (2000).
PAJ, Abstract of JP2004-083804.
PAJ, Abstract of JP2004-168897.

* cited by examiner

*Primary Examiner* — Mark Kopec
*Assistant Examiner* — Jaison Thomas
(74) *Attorney, Agent, or Firm* — John H. Hornickel

(57) ABSTRACT

An electrically conductive polymer compound is disclosed. The compound comprises a matrix comprising two polyolefin copolymers having different melt mass flow rates and electrically conductive functional additive particles dispersed in the matrix. The compound is useful for making extruded and molded plastic articles that need electrical conductivity.

13 Claims, No Drawings

ELECTRICALLY CONDUCTIVE POLYOLEFIN BLENDS

CLAIM OF PRIORITY

This application claims priority from U.S. Provisional Patent Application Ser. No. 60/955,435 filed on Aug. 13, 2007, which is incorporated by reference.

FIELD OF THE INVENTION

This invention concerns thermoplastic polymer compositions which are electrically conductive.

BACKGROUND OF THE INVENTION

Thermoplastic articles can be superior to metal because they do not corrode and can be molded or extruded into any practical shape. Thermoplastic articles are also superior to glass because they do not shatter when cracking.

Thermoplastic articles can be made to be electrically conductive if sufficient amounts of electrically conductive particles are dispersed in the articles. Some laboratory equipment needs to be electrically conductive, and neither metal nor glass articles are practical.

SUMMARY OF THE INVENTION

Therefore, what the art needs is an electrically conductive thermoplastic compound that can be used to make thermoplastic articles for use in electrically conductive circumstances, particularly where the surface of the thermoplastic article needs to have at least low surface electrical resistivity or even electrical conductivity.

The present invention has solved that problem by a blend of two thermoplastic resins with electrically conductive particles dispersed therein.

Thus, one aspect of the invention is an electrically conductive polymer compound, comprising a matrix comprising two polyolefin copolymers having different melt mass flow rates and electrically conductive particles dispersed in the matrix.

Features of the invention will be explained below.

EMBODIMENTS OF THE INVENTION

Thermoplastic Polymer Matrix Blend
First Polyolefin Copolymer

The first of the two polyolefin copolymers in the matrix is a polyolefin copolymer that has propylene as a co-monomer and more preferably an ethylene-propylene copolymer. The copolymer is selected because it is tough and durable and at least translucent and preferably transparent. The copolymer can have a melt mass flow rate of about 0.5 to about 40 g/10 min. measured at 230° C. and 2.16 kg (ASTM D1238 or ISO 1133).

One commercially available ethylene-propylene copolymer is Pro-fax brand copolymer from Basell, particularly Pro-fax EP390S copolymer which has a melt mass flow rate of 35 g/10 min. measured at 230° C. and 2.16 kg (ASTM D1238 or ISO 1133).

Second Polyolefin Copolymer

The second of the two copolymers in the matrix is a polyolefin copolymer also having propylene as a co-monomer but having a higher melt mass flow rate than the melt mass flow rate of the first polyolefin copolymer. More specifically, the second copolymer can have a melt mass flow rate of about 30 to about 100 g/10 min. measured at 230° C. and 2.16 kg (ASTM D1238 or ISO 1133).

The second polyolefin copolymer is highly compatible with the first polyolefin copolymer, preferably miscible with ethylene-propylene copolymer in the event that either or both of the polyolefin copolymers is ethylene-propylene copolymer.

An ethylene-propylene copolymer with a higher melt mass flow rate than Pro-fax EP390S is Sunoco brand copolymer from Sunoco Chemicals, Polymer Division, particularly Sunoco PP TI-5600-M copolymer which has a melt mass flow rate of 65 g/10 min. measured at 230° C. and 2.16 kg (ASTM D1238 or ISO 1133).

The differential in melt mass flow rates of the two polyolefin copolymers can be expressed in a variety of ways. The arithmetic differential of melt mass flow rates can range from about 10 to about 90. The ratio differential of melt mass flow rate of first polymer: melt mass flow rate of second polymer can range from about 2:3 to about 1:90.

Electrically Conductive Particles

Any conventional electrically conductive particle is a candidate to serve as the functional additive for the compound of the present invention. Without undue experimentation, one of ordinary skill in the art can select an electrically conductive particle based on considerations of cost, manufacturing technique, physical properties, chemical properties, etc.

The particles can be metallic or non-metallic or both. If non-metallic, they are not galvanically active.

Non-limiting examples of metallic particles are copper, silver, iron, and the like. Non-limiting examples of non-metallic particles are carbon fibers, carbon black particles, carbon nanotubes, and the like.

The particles can have aspect ratios ranging from 1:1 to 100:1 and can have particle sizes ranging from the nanometric to the micrometric region.

A commercial source of carbon black particles is Cabot Corporation with its Vulcan brand carbon black powders, especially Vulcan XC72R brand carbon black powders which have a bulk density of about 6 pounds/cubic foot (96 kg/m$^3$).

Optional Other Additives

The compound of the present invention can include conventional plastics additives in an amount that is sufficient to obtain a desired processing or performance property for the compound. The amount should not be wasteful of the additive nor detrimental to the processing or performance of the compound. Those skilled in the art of thermoplastics compounding, without undue experimentation but with reference to such treatises as *Plastics Additives Database* (2004) from Plastics Design Library (www.williamandrew.com), can select from many different types of additives for inclusion into the compounds of the present invention.

Non-limiting examples of optional additives include adhesion promoters; biocides (antibacterials, fungicides, and mildewcides), anti-fogging agents; anti-static agents; bonding, blowing and foaming agents; dispersants; fillers and extenders; fire and flame retardants and smoke suppressants; impact modifiers; initiators; lubricants; micas; pigments, colorants and dyes; plasticizers, such as core/shell impact modifiers; processing aids; release agents; silanes, titanates and zirconates; slip and anti-blocking agents; stabilizers; stearates; ultraviolet light absorbers; viscosity regulators; waxes; catalyst deactivators, and combinations of them.

Ingredients

Table 1 shows the acceptable, desirable, and preferred amounts of each of the ingredients discussed above, recognizing that the optional ingredients need not be present at all. All amounts are expressed in weight percent of the total compound.

TABLE 1

Range of Ingredients

|  | Acceptable | Desirable | Preferable |
|---|---|---|---|
| First Polyolefin Copolymer Matrix (Lower Melt Mass Flow Rate) | 30-75 | 35-65 | 45-55 |
| Second Polyolefin Copolymer Matrix (Higher Melt Mass Flow Rate) | 5-45 | 10-40 | 20-30 |
| Electrically Conductive Particles | 5-45 | 10-40 | 20-30 |
| Optional Other Additives | 0-10 | 0.5-5 | 0.5-2 |

Processing

The preparation of compounds of the present invention is uncomplicated. The compound of the present can be made in batch or continuous operations.

Mixing in a continuous process typically occurs in a single or twin screw extruder that is elevated to a temperature that is sufficient to melt the polymer matrix with addition of other ingredients either at the head of the extruder or downstream in the extruder. Extruder speeds can range from about 50 to about 500 revolutions per minute (rpm), and preferably from about 100 to about 300 rpm. Typically, the output from the extruder is pelletized for later extrusion or molding into polymeric articles.

Mixing in a batch process typically occurs in a Banbury mixer that is capable of operating at a temperature that is sufficient to melt the polymer matrix to permit addition of the solid ingredient additives. The mixing speeds range from 60 to 1000 rpm. Also, the output from the mixer is chopped into smaller sizes for later extrusion or molding into polymeric articles.

Subsequent extrusion or molding techniques are well known to those skilled in the art of thermoplastics polymer engineering. Without undue experimentation but with such references as "Extrusion, The Definitive Processing Guide and Handbook"; "Handbook of Molded Part Shrinkage and Warpage"; "Specialized Molding Techniques"; "Rotational Molding Technology"; and "Handbook of Mold, Tool and Die Repair Welding", all published by Plastics Design Library (www.williamandrew.com), one can make articles of any conceivable shape and appearance using compounds of the present invention.

The compounds of the present invention are particularly suitable for thin-wall injection molding. Without being limited to a particular theory, it is believed that because the second polyolefin copolymer has a higher melt mass flow rate, it is more likely to move faster toward the heated walls of a mold and is therefore more likely to carry with it the electrically conductive particles dispersed in the blend of the two polymer matrices. As a result, it is believed that surface electrical conductivity of the resulting molded article is enhanced, perhaps arising from the congregation of the electrically conductive particles in the higher melt mass flow rate copolymer which moves closer and faster to the heated mold surface than does the lower melt mass flow rate copolymer.

USEFULNESS OF THE INVENTION

Compounds of the present invention can be molded into any shape which benefits from having electrically conductive surfaces. Compounds of the present invention can be used by anyone who purchases Stat-Tech brand conductive polymer compounds from PolyOne Corporation (www.polyone.com) for a variety of industries, such as the medical device industry or the electronics industry where disposable plastic articles are particularly useful in laboratory or manufacturing conditions. Examples of electronics industry usage includes media carriers, process combs, shipping trays, printed circuit board racks, photomask shippers, carrier tapes, hard disk drive components, etc. Examples of medical industry usage includes electromagnetic interference shielding articles, tubing, drug inhalation devices, laboratory pipette tips, implantable medical device components, biomedical electrodes, and other devices that need protection from electrostatic discharge, static accumulation, and electromagnetic interference.

A formulation having the ingredients shown in Table 2 was found to be suitable for medical industry usage because of suitable electrically conductivity at the surface of the molded plastic article.

TABLE 2

Conductive Polymer Formulation

| Ingredients | Wt. % |
|---|---|
| Basell Pro-fax EP390S EP copolymer (35 g/10 min. Melt Mass Flow Rate) | 49.35 |
| Sunoco PP TI-5600-M EP copolymer (65 g/10 min Melt Mass Flow Rate) | 25.00 |
| Vulcan XC72R carbon black powder | 25.00 |
| Chemtura Irganox B225 anti-oxidant blend | 0.20 |
| Calcium stearate | 0.20 |
| Rohm & Haas Advawax 280-RH wax | 0.25 |

The invention is not limited to the above embodiments. The claims follow.

What is claimed is:

1. An electrically conductive polymer compound, comprising:
   (a) a matrix comprising a first polyolefin copolymer and a second polyolefin copolymer wherein the two polyolefin copolymers have different melt mass flow rates, and
   (b) electrically conductive particles dispersed in the matrix,
   wherein both copolymers are ethylene-propylene copolymer,
   wherein the melt mass flow rate of the first copolymer is about 30 to 90 lower in g/10 min, than the second copolymer when measured at 230° C. and 2.16 kg using ASTM D1238, and
   wherein the amount of the first copolymer ranges from about 30 to about 75 weight percent of the compound, wherein the amount of the second copolymer ranges from about 5 to about 45 weight percent of the compound, and wherein the electrically conductive particles ranges from about 5 to about 45 weight percent of the compound.

2. The compound of claim 1, wherein the melt mass flow rates of the two copolymers have a ratio of from about 2:3 to about 1:90 when measured at 230° C. and 2.16 kg using ASTM D1238.

3. The compound of claim 1, wherein the electrically conductive particles are metallic, non-metallic, or both.

4. The compound of claim 1, wherein the electrically conductive particles are carbon black powders.

5. A molded plastic article made from the compound of claim 1.

6. The plastic article of claim 5, wherein the surface of the plastic article is electrically conductive.

7. The plastic article of claim 5, wherein the article is used in the electronics industry and is in the shape of a media carrier, a process comb, a shipping tray, a printed circuit board rack, a photomask shipper, a carrier tape, or a hard disk drive component.

8. The plastic article of claim 5, wherein the article is used in the medical industry and is in the shape of an electromagnetic interference shielding article, tubing, a drug inhalation device, an implantable medical device component, or a biomedical electrode.

9. The compound of claim 1, wherein the melt mass flow rate of the second copolymer is about 30 higher in g/10 min, than the first copolymer when measured at 230° C. and 2.16 kg using ASTM D1238.

10. The compound of claim 9, wherein the melt mass flow rates of the two polyolefin copolymers total about 100 in g/10 min, when measured at 230° C. and 2.16 kg using ASTM D1238.

11. The compound of claim 10, wherein the electrically conductive particles are metallic, non-metallic, or both.

12. The compound of claim 10, wherein the electrically conductive particles are carbon black powders.

13. The compound of claim 1, wherein the melt mass flow rates of the two polyolefin copolymers total about 100 in g/10 min, when measured at 230° C. and 2.16 kg using ASTM D1238.

* * * * *